United States Patent
Mayukh et al.

(10) Patent No.: US 12,438,062 B2
(45) Date of Patent: Oct. 7, 2025

(54) POLYMERIZED THERMAL INTERFACE MATERIAL WITH SURFACE MODIFIED LIQUID METAL SPHERES AND METHOD OF MAKING

(71) Applicant: Avago Technologies International Sales Pte. Limited, Singapore (SG)

(72) Inventors: Mayank Mayukh, Fort Collins, CO (US); Shrikara Prabhu Tendel, Singapore (SG); Sam Karikalan, Irvine, CA (US); Nicole A Butel, Fort Collins, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 584 days.

(21) Appl. No.: 17/390,474

(22) Filed: Jul. 30, 2021

(65) Prior Publication Data

US 2023/0034217 A1 Feb. 2, 2023

(51) Int. Cl.
*H01L 23/48* (2006.01)
*C09K 5/10* (2006.01)
*C09K 5/14* (2006.01)
*H01L 21/52* (2006.01)
*H01L 23/373* (2006.01)
*H01L 23/52* (2006.01)
*H01L 23/367* (2006.01)
*H01L 25/065* (2023.01)
*H01L 25/18* (2023.01)

(52) U.S. Cl.
CPC ............ *H01L 23/3737* (2013.01); *C09K 5/10* (2013.01); *C09K 5/14* (2013.01); *H01L 21/52* (2013.01); *H01L 23/3733* (2013.01); *H01L 23/3675* (2013.01); *H01L 25/0655* (2013.01); *H01L 25/18* (2013.01)

(58) Field of Classification Search
CPC . H01L 23/3737; H01L 21/52; H01L 23/3733; H01L 23/3675; H01L 25/0655; H01L 25/18; H01L 23/3736; C09K 5/10; C09K 5/14

See application file for complete search history.

(56) References Cited

U.S. PATENT DOCUMENTS

| | | | |
|---|---|---|---|
| 10,777,483 B1 * | 9/2020 | Kazem | H01L 23/3733 |
| 2004/0262740 A1 | 12/2004 | Matayabas, Jr. et al. | |
| 2005/0228097 A1 | 10/2005 | Zhong | |
| 2010/0124657 A1 * | 5/2010 | Hirano | C08K 9/08 977/773 |
| 2018/0056598 A1 * | 3/2018 | Kuczynski | B29C 48/022 |
| 2018/0323130 A1 | 11/2018 | Liu et al. | |
| 2019/0181069 A1 * | 6/2019 | Rykaczewski | B32B 27/283 |

(Continued)

FOREIGN PATENT DOCUMENTS

WO WO-2015186959 A1 * 12/2015 ............ C08J 3/20

OTHER PUBLICATIONS

Foreign Search Report on non-Foley case related to US Dtd Dec. 19, 2022.

*Primary Examiner* — Ismail A Muse
(74) *Attorney, Agent, or Firm* — Foley & Lardner LLP

(57) ABSTRACT

An integrated circuit (IC) package includes a one or more die, a package substrate, a thermal interface material, and a cover. The cover is disposed over or above the one or more die. The thermal interface material includes a surface modified metal and a silicon monomer.

20 Claims, 6 Drawing Sheets

(56) References Cited

U.S. PATENT DOCUMENTS

| | | | |
|---|---|---|---|
| 2022/0098461 A1* | 3/2022 | Majidi | C09K 5/10 |
| 2022/0199489 A1* | 6/2022 | Arrington | H01L 23/3737 |
| 2022/0270949 A1* | 8/2022 | Yeh | H01L 23/3675 |
| 2023/0044133 A1* | 2/2023 | Jeong | H01B 13/06 |
| 2024/0174816 A1* | 5/2024 | Bark | H10N 10/13 |

* cited by examiner

FIG. 6

| Polymer | $R_1$ | $R_2$ | X | Y | Z |
|---|---|---|---|---|---|
| 1a | $R_1(A)$ | $R_2(A)$ | X(A) | Y(A) | N/A |
| 1b | $R_1(A)$ | $R_2(A)$ | X(A) | Y(B) | N/A |
| 1c | $R_1(A)$ | $R_2(A)$ | X(A) | Y(C) | N/A |
| 1d | $R_1(A)$ | $R_2(A)$ | X(B) | Y(B) | N/A |
| 1e | $R_1(A)$ | $R_2(A)$ | X(B) | Y(C) | N/A |
| 1f | $R_1(A)$ | $R_2(A)$ | X(C) | Y(C) | N/A |
| 2a | $R_1(B)$ | $R_2(B)$ | X(A) | Y(A) | N/A |
| 2b | $R_1(B)$ | $R_2(B)$ | X(A) | Y(B) | N/A |
| 2c | $R_1(B)$ | $R_2(B)$ | X(A) | Y(C) | N/A |
| 2d | $R_1(B)$ | $R_2(B)$ | X(B) | Y(B) | N/A |
| 2e | $R_1(B)$ | $R_2(B)$ | X(B) | Y(C) | N/A |
| 2f | $R_1(B)$ | $R_2(B)$ | X(C) | Y(C) | N/A |
| 3 | $R_1(C)$ | N/A | N/A | N/A | Z(D) |
| 4a | $R_1(D)$ | $R_2(D)$ | X(A) | Y(A) | N/A |
| 4b | $R_1(D)$ | $R_2(D)$ | X(A) | Y(B) | N/A |
| 4c | $R_1(D)$ | $R_2(D)$ | X(A) | Y(C) | N/A |
| 4d | $R_1(D)$ | $R_2(D)$ | X(B) | Y(B) | N/A |
| 4e | $R_1(D)$ | $R_2(D)$ | X(B) | Y(C) | N/A |
| 4f | $R_1(D)$ | $R_2(D)$ | X(C) | Y(C) | N/A |

FIG. 7

POLYMERIZED THERMAL INTERFACE
MATERIAL WITH SURFACE MODIFIED
LIQUID METAL SPHERES AND METHOD
OF MAKING

BACKGROUND OF THE DISCLOSURE

One or more integrated circuits (ICs) can be provided on or within a module or integrated circuit package. The package can be a multi-chip module or a single chip package. Each of the one or more ICs is generally provided on a die that is connected by fine wires or by solder bumps to a package substrate. The single chip package or multichip module often includes a cover or other protective structure that covers the one or more ICs. The term integrated circuit or IC package as used herein includes single chip packages and multi-chip modules.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIG. 6 is a diagram showing exemplary monomers for use in the exemplary operations illustrated in FIGS. 4-5 according to some embodiments; and FIG. 7 is a diagram showing exemplary combinations of the monomers shown in FIG. 7 according to some embodiments.

DETAILED DESCRIPTION

Figure 1:
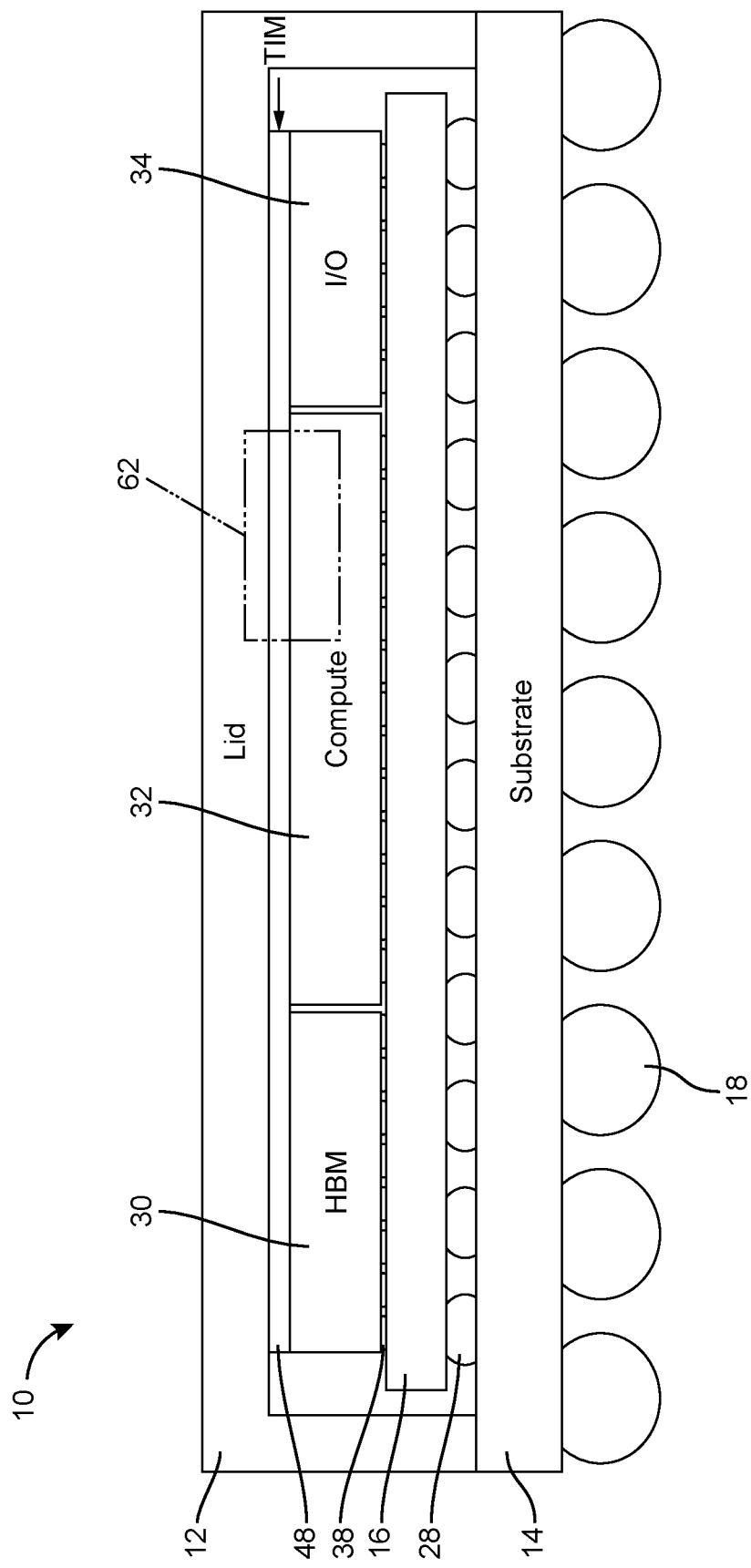
FIG. 1 is a cross sectional view schematic drawing of an integrated circuit package according to some embodiments.

Before turning to the features, which illustrate some exemplary embodiments in detail, it should be understood that the application is not limited to the details or methodology set forth in the description or illustrated in the Figures. It should also be understood that the terminology is for the purpose of description only and should not be regarded as limiting.

Referring generally to the Figures, devices can be provided in IC packages (e.g., as single chip packages having a single IC or as a system in package (SiP) having two or more ICs or dies in a package (e.g., a multi-chip module) according to various exemplary embodiments. IC packages and methods related to IC packages utilize surface modified liquid metal spheres to provide a robust liquid metal polymer composite thermal interface material in some embodiments. In some embodiments, a liquid metal polymer composite thermal interface material provides superior heat extraction. The liquid metal polymer composite thermal interface material provides a more heat conductive path to a heat sink or heat spreader in some embodiments. In some embodiments, the thermal interface material is configured to be thermally and mechanically reliable and can be used in higher power IC devices. In some embodiments, copolymerization of surface modified liquid-metal and silicon monomers provides a robust material with uniform distribution of thermally conductive liquid-metal in the polymer matrix.

Liquid metal has high thermal conductivity but generally exhibits poor reliability. Liquid metal loaded polymers have good thermal conductivity and reliability but generally lack homogeneity—liquid metal is severely depleted at the edges due to insufficient interaction between liquid metal and polymer. Silicon monomers organo-metallically or covalently bonded to the liquid metal create copolymerized silicon monomers that provide strong bonding and overcome the limitations of certain conventional liquid metal loaded polymers in some embodiments.

According to some embodiments, a package includes a one or more die, a package substrate, a thermal interface material, and a cover. The cover is disposed over or above the one or more die. The thermal interface material includes a surface modified metal and a silicon monomer.

Some embodiments relate to a method of fabricating an integrated circuit package. The method includes attaching a die to a substrate, providing a polymerized material including two monomers and a liquid metal. The liquid metal is bonded by a covalent bond or organometallic bond to at least one of the two monomers. The method also includes providing a cover over the die, and the polymerized material is disposed in at least a region between the cover and the die.

Some embodiments relate to a thermal interface material for an integrated circuit package. The thermal interface material includes a polymer matrix comprising copolymerized modified liquid-metal and a silicon monomer.

Some embodiments relate to a thermal interface material for an integrated circuit package. The thermal interface material includes a polymer matrix comprising copolymerized modified liquid-metal and a monomer attached to the liquid metal using at an: C=O,S=O,N:, NH, and/or OH moiety.

With reference to FIG. 1, an integrated circuit package 10 (e.g., system in package (SiP)) includes cover 12 (e.g., a lid), a package substrate 14, an interconnect board 16, a die 30, a die 32, a die 34, and thermal interface material 48. Integrated circuit package 10 is a single die package or a multiple die package in some embodiments. Integrated circuit package 10 is configured for side-by-side die packaging, three dimensional packaging, embedded packaging, and other configurations for containing one or more of die 30, 32, and 34. Integrated circuit package 10 and components thereof can have a variety thicknesses and sizes depending on die area and system criteria.

A set 28 of solder balls can interconnect board 16 to die 30, 32, and 34 in some embodiments. The die 30, 32, and 34 are coupled to the interconnect board 16 in a flip chip configuration in some embodiments. The set 28 of solder balls can be pins, solder bumps, wires, or other structures for coupling die 30, 32, and 34 to interconnect board 16 or other circuit boards, other devices, or substrates in some embodiments. In some embodiments, die 30, 32, and 34 are coupled directly to the package substrate 14 by solder balls, pins, solder bump, wires, or other structures.

Die 30, 32 and 34 can be any type of electronic device including a memory, a processor, a radio frequency circuit, programmable logic device, application specific integrated circuit (ASIC), or other logic device. In some embodiments, die 30 is a DRAM or high bandwidth memory (HBM) chip, die 32 is a computer or processor chip, and die 34 is an input/output module. Die 30, 32, and 34 are coupled to the substrate 14 via set 28 of solder balls and interconnect board 16 in some embodiments. A set 18 of solder balls can be provided on a bottom of substrate 14 for coupling to circuit boards or other components. The set 18 of solder balls can be pins, solder bump, wires, or other structures.

The substrate 14 and interconnect board 16 can be any type of IC package circuit board. In some embodiments, interconnect board 16 and package substrate 14 are ceramic boards. In some embodiments, interconnect board 16 and package substrate 14 are alumina, aluminum nitride or beryllium oxide, flex, or fiberglass circuit boards.

Cover 12 is a metal, metal composite, or ceramic material in some embodiments. Cover 12 is adhered to substrate 14 in some embodiments. Cover 12 can be coupled to or integrated with a heat sink or heat spreader for heat dissipation in some embodiments. Cover 12 is tungsten, copper, copper-diamond, silver-diamond, aluminum, silicon carbide, gold, nickel, and alloys thereof in some embodiments.

Figure 2:
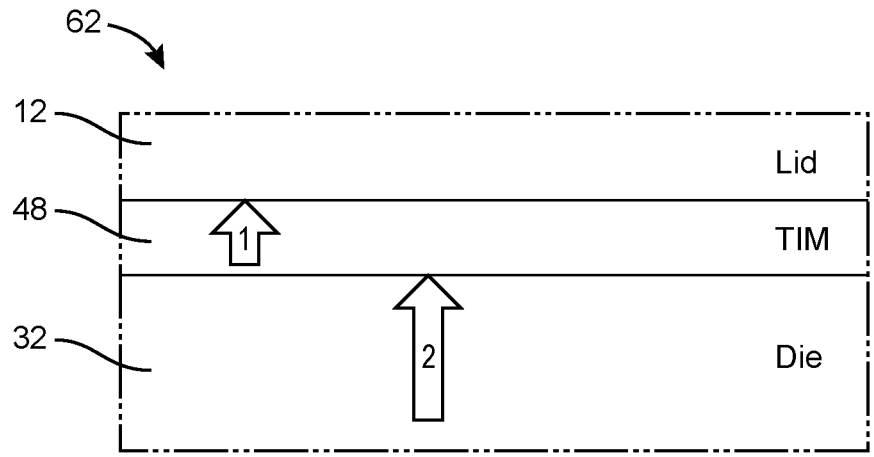
FIG. 2 is a more detailed cross sectional view schematic drawing of the integrated circuit package illustrated in FIG. 1 showing a cover, an integrated circuit (IC) die and a thermal interface material (TIM), according to some embodiments.

With reference to FIGS. 1 and 2, thermal interface material 48 is disposed in a region between cover 12 and at least one of die 30, 32, and 34. An enlarged area 62 of integrated circuit package 10 is shown in FIG. 2. Thermal interface material 48 can be provided in other regions where thermal conductivity is desired. In some embodiments, thermal interface material 48 is configured for heat dissipation and is an insulating material. In some embodiments, thermal interface material 48 includes a liquid metal material disposed in a polymerized matrix. The liquid metal material is liquid phase eutectic gallium-indium micro droplets in some embodiments. In some embodiments, thermal interface material 48 is configured for homogeneity in the polymerized matrix and is not significantly depleted at edges of the polymerized matrix. Arrows 1 and 2 show heat dissipation through the die 32 and the thermal interface material 48 to the cover or cover 12.

Figure 3:
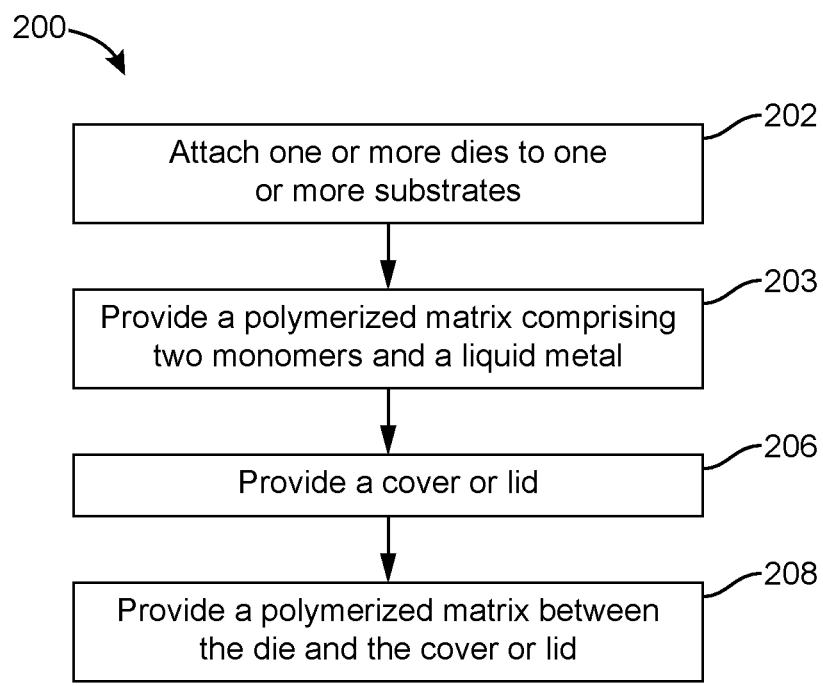
FIG. 3 is flow diagram showing exemplary operations for fabricating the integrated circuit package illustrated in FIG. 1 according to some embodiments.

With reference to FIG. 3, a flow 200 is performed to fabricate the integrated circuit package 10 with the thermal interface material 48. Flow 200 exemplary only and is not limited to operations performed in a particular order.

At an operation 202, one or more die (e.g., die 30, 32, and 34) are attached to interconnect board 16 or other circuit board/substrate for housing die. The interconnect board 16 can be a single package substrate which is part of the integrated circuit package 10 or can be one of two or more circuit boards in the integrated circuit package 10. The interconnect board 16 is an intermediate board, interposer, or the top most or bottom most substrate (e.g., package substrate 14) in some embodiments. Die 30, 32, and 34 are attached by flip chip technology using solder balls or bumps. Other techniques for attaching die 30, 32, and 34 to die substrate or interconnect board 16 include adhesives, wire bonding, and pins.

At an operation 203, a polymerized matrix including liquid metal material is provided. The polymerized matrix is provided over or above die 32, 34, and/or 36 as the thermal interface material 48 (FIG. 1) between die 32 and cover 12 in some embodiments. The polymerized matrix is dispensed, deposited, spin-coated, injected, sprayed, spread, applied as a pre-formed film, or otherwise applied above the package substrate 16 and die 30, 32, and/or 34 in some embodiments. The polymerized matrix includes silicon in some embodiments. In some embodiments, the polymerized matrix includes two monomers with one monomer bonded to the liquid metal material and the other monomer bonded to the monomer bonded to the liquid metal material. In some embodiments, the polymerized matrix is formed as described below with reference to FIGS. 4-7.

In some embodiments, the materials such as polysiloxane (e.g. silicone, polydimethylsiloxane, RTV silicones), polyurethane, polyacrylate, natural (latex) rubber, polyisobutylene, block copolymer elastomers (e.g. styrene ethylene butylene styrene), polychloroprene, thermoplastic elastomers (e.g. propylene-ethylene co-polymer), polyphenylenes and their derivatives, polybutadiene, butadiene-acrylonitrile, vinyl acetates, polyurethanes, polyamides, and other similar materials can be included in the polymerized matrix. In some embodiments, the liquid metal material is included in the polymerized matrix and includes materials, such as, eutectic gallium indium (EGain), gallium-indium-tin (Galinstan), Indalloy, NewMerc, mercury, other metals that are liquid at lower temperatures than other metals, and combinations and alloys thereof.

In an operation 206, a cover 12 is provided over die 30, 32, and/or 34 and is attached to package substrate 14 or interconnect board 16. Operation 206 can be performed before or after operation 203. Cover 12 is adhered to package substrate 14 about its perimeter in some embodiments. Cover 12 can be soldered or otherwise connected to package substrate 14 or interconnect board 16 in some embodiments.

Figure 4:
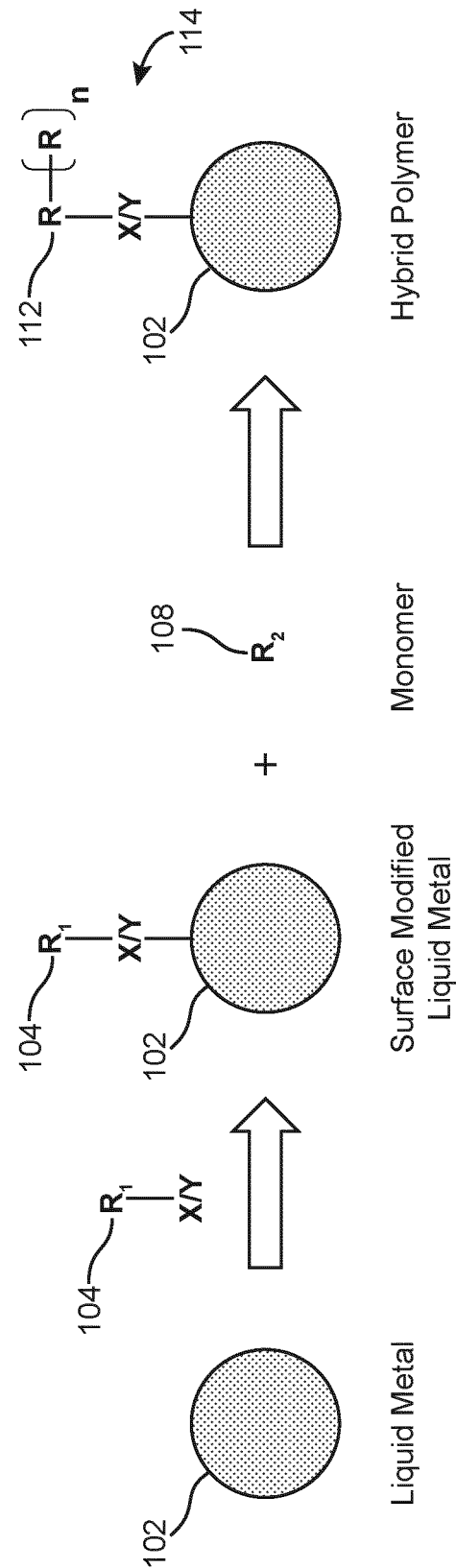
FIG. 4 is a flow diagram showing exemplary operations for fabricating a polymerized liquid metal matrix for the integrated circuit package illustrated in FIG. 1 according to some embodiments.

With reference to FIG. 4, thermal interface material 48 (FIG. 1) is comprised of liquid metal 102 and a polymer 112 including a monomer 104 and a monomer 108. The liquid metal 102 is blended with monomer 104 to form surface modified liquid metal, which upon polymerization with monomer 108 led to the polymer 112 to form the thermal interface material 114 (e.g., a copolymerized material) in some embodiments. The liquid metal 102 is liquid at room temperature and is encapsulated inside of the polymer 112. In some embodiments, the characteristics (e.g., thermal expansion, etc.) of the liquid metal 102 and polymer 112 are chosen to be compatible for stability across environmental conditions. In some embodiments, thermal interface material 48 includes polymer 112 (e.g., an elastomer matrix) embedded with liquid metal 102.

In some embodiments, the liquid metal 102 has a spherical shape (e.g., micro droplets) due to lowest surface energy for a given volume. The monomer 104 bonds to the liquid metal 102 and modifies the surface of the liquid metal 102. In some embodiments, organometallic chemistry uses a catalyst to attach monomer 104 directly to the liquid metal 102. In some embodiments, the surface of the spherical liquid metal material is modified such that the spheres become elongated. Ultraviolet light, heat, and other activating techniques can be utilized. A metal bond or an organometallic bond is formed which is robust in some embodiments.

Monomer 104 includes an R group (e.g., $R_1$ group) and an X and/or Y group in some embodiments. R groups and X and Y groups are discussed below. The bond between liquid metal 102 and monomer 104 is formed using the X and/or Y group in some embodiments.

After the monomer 104 is bonded to liquid metal 102, a monomer 108 is added. Monomer 108 includes silicon in some embodiments. Monomer 104 also includes silicon in some embodiments. Monomer 108 includes an R group (e.g., $R_2$ group). Monomer 108 bonds to monomer 104 (e.g., $R_1$ group is covalently bonded to $R_2$ group) to form a polymer 112 in some embodiments. In some embodiments, the monomer 108 overcomes limitations associated with limitations of liquid metal polymers. Polymer 112 includes R1 bonded to R2 with m X portions and n $R_2$ portions (e.g., R—(—R)$_n$) where m and n are integers (e.g., 100-100000) in some embodiments. Polymer 112 combined with liquid metal 102 forms polymeric matrix 114 in some embodiments.

Figure 5:
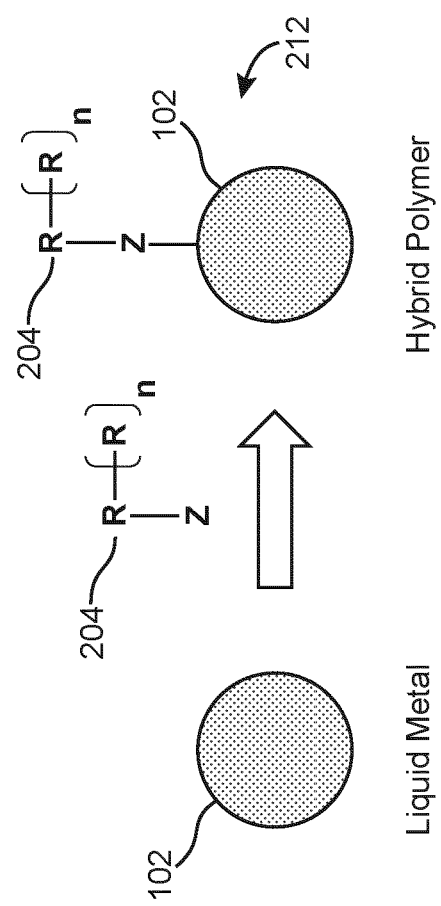
FIG. 5 is a flow diagram showing exemplary operations for fabricating a polymerized liquid metal matrix for the integrated circuit package illustrated in FIG. 1 according to some embodiments.

With reference to FIG. 5, thermal interface material 48 (FIG. 1) is comprised of liquid metal 102 and a polymer 204 including at least two R groups (e.g., monomers) and a Z group. R groups and X and Y groups are discussed below. The bond between liquid metal 102 and polymer 204 is formed using the Z group in some embodiments.

The liquid metal 102 is blended with the polymer 204 to form the thermal interface material 48 as hybrid polymeric matrix 212. Polymer 204 includes an R group bonded to another R group with a Z group and n+1 R portions (e.g., R—(—R)$_n$) where m is an integer (e.g., 100-100000). Polymeric matrix 212 is similar to polymeric matrix 114 in some embodiments. The bond between liquid metal 102 and polymer 204 is formed using the Z group in some embodiments.

Figure 6:
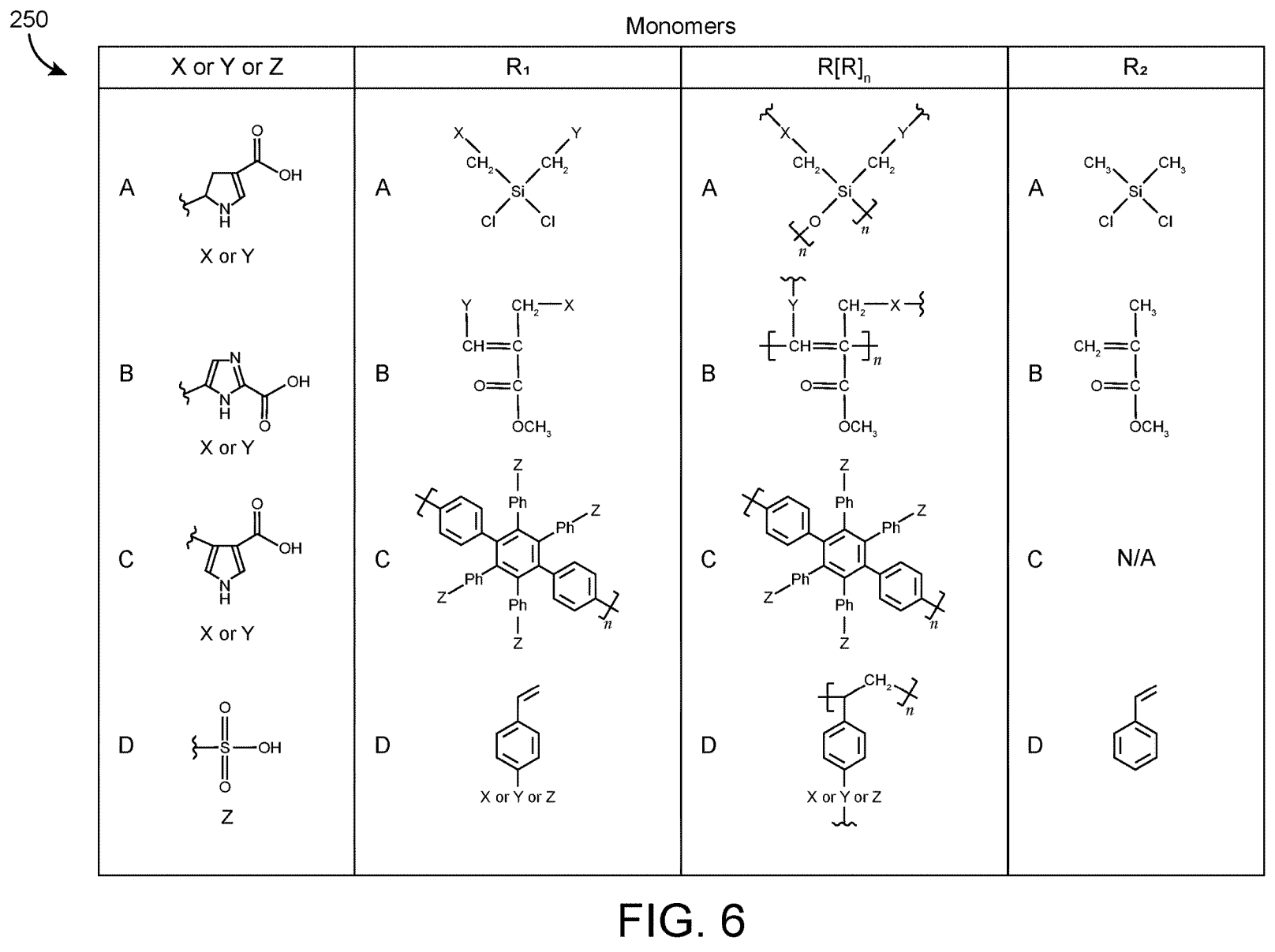

With reference to FIG. 6, a table 250 includes a first column showing exemplary X, Y, and Z groups, a second column showing exemplary $R_1$ groups with X, Y and Z group locations, a third column showing exemplary R—(—R)$_n$ groups with X, Y and Z group locations, and a fourth column showing exemplary $R_2$ groups with X, Y and Z group locations. In the first column of table 250, the first three rows (rows A-C) list X or Y groups. The X or Y groups bond to the liquid metal 102 (FIG. 4) at the C=O/OH location in some embodiments. The NH location provides additional bonding in some embodiments. The symbol { represents the bond location to $R_1$ or $R_2$ groups. Row B shows non-silicon based groups for $R_1$ and $R_2$ groups.

The third row (row C) of table 250 shows a single $R_1$ group without an $R_2$ group and the $R_1$ group of Row C is bondable to the Z group in the fourth row (row D). The $R_1$ and $R_2$ groups in row D are bondable to X and Y groups.

With reference to FIG. 8, a table 280 lists exemplary combinations of the $R_1$ and $R_2$ groups and X, Y, and Z groups provided in FIG. 7, where each row is a unique combination. Nineteen exemplary combinations are shown in FIG. 7. For example, polymer 1a is a combination of the $R_1$ and $R_2$ groups and X and Y groups from row A of table 250. Polymer 1b is a combination of the $R_1$ and $R_2$ groups and the X group from row A of table 250 and the Y group from row B of table 250. Polymer 1c is a combination of the $R_1$ and $R_2$ groups and the X group from row A of table 250 and the Y group from row c of table 250. Polymer 3 is a combination of the $R_1$ group from row A of table 250 and the Z group from row D of table 250. Polymer 4a is a combination of the $R_1$ and $R_2$ groups from row D of table 250 and the X and Y group from row A of table 250. Other combinations are indicated in table 250 according to similar conventions. The symbol N/A refers to the term not applicable. Additional combinations of monomers are possible.

The dimensions, thicknesses, configurations and materials disclosed herein are exemplary only. Although only a side-by-side multichip configuration is shown, additional layers and configurations including dies can be added (e.g., three die stack configuration or more) in some embodiments.

The disclosure is described above with reference to drawings. These drawings illustrate certain details of specific embodiments that implement the systems and methods and programs of the present disclosure. However, describing the disclosure with drawings should not be construed as imposing on the disclosure any limitations that are present in the drawings. The embodiments of the present disclosure can be implemented using various types of dies. No claim element herein is to be construed as a "means plus function" element unless the element is expressly recited using the phrase "means for." Furthermore, no element, component or method step in the present disclosure is intended to be dedicated to the public, regardless of whether the element, component or method step is explicitly recited in the claims.

It should be noted that certain passages of this disclosure can reference terms such as "first" and "second" in connection with devices for purposes of identifying or differentiating one from another or from others. These terms are not intended to relate entities or operations (e.g., a first region and a second region) temporally or according to a sequence, although in some cases, these entities can include such a relationship. Nor do these terms limit the number of possible entities or operations.

It should be understood that the circuits described above can provide multiple ones of any or each of those components. In addition, the structures, circuits and methods described above can be adjusted for various system parameters and design criteria, such as shape, depth, thicknesses, material, etc. Although shown in the drawings with certain components directly coupled to each other, direct coupling is not shown in a limiting fashion and is exemplarily shown. Alternative embodiments include circuits with indirect coupling or indirect attachment between the components shown.

It should be noted that although steps are described in an order, it is understood that the order of these steps can differ from what is depicted. Also two or more steps can be performed concurrently or with partial concurrence. Such variation will depend on the recipes and systems chosen and on designer choice. It is understood that all such variations are within the scope of the disclosure.

While the foregoing written description of the methods and systems enables one of ordinary skill to make and use what is considered presently to be the best-mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A package, comprising:
   a one or more die;
   a package substrate;
   a thermal interface material; and
   a cover disposed over the one or more die, wherein the thermal interface material comprises a modified liquid metal material and a first monomer, wherein the first monomer is chemically bonded to the modified liquid metal material, wherein the modified liquid metal material comprises a second monomer comprising a first group directly bonded to a metal material of the modified liquid metal material, wherein the first group comprises at least one of the following groups:

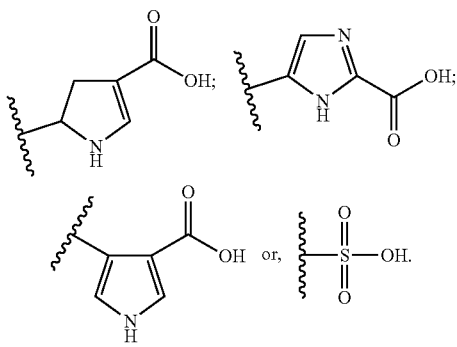

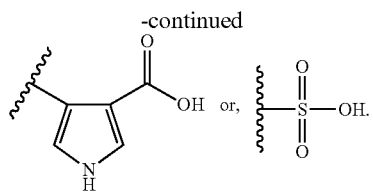

2. The package of claim 1, wherein the metal material is chemically bonded to the first group at a C+O/OH location.

3. The package of claim 1, wherein additional bonding to the metal material is provided by and NH location in the first group.

4. The package of claim 1, wherein the metal material is chemically bonded to the first group by a covalent or organometallic bond.

5. The package of claim 1, wherein the thermal interface material is disposed between the cover and the one or more die.

6. The package of claim 1, wherein the thermal interface material is comprised of a polymer comprising the first monomer and the second monomer and wherein the first group polymer is bonded to the metal material by an organometallic bond, coordinate, or a covalent bond and the polymer comprises silicon.

7. The package of claim 6, wherein the cover is attached to the package substrate and the one or more die are attached to the package substrate.

8. The package of claim 1, wherein the thermal interface material is comprised of surface modified liquid spheres.

9. The package of claim 1, the first group comprises sulfur thermal interface material is comprised of a polymer comprised of the first monomer and a second monomer.

10. The package of claim 9, wherein the second monomer is bonded to the first monomer.

11. A method of fabricating an integrated circuit package, the method comprising:
attaching a die to a substrate;
providing a polymerized material comprising a plurality of monomers and a liquid metal, the liquid metal being bonded by a covalent bond or organometallic bond to a group of one of the monomers, wherein the group comprises one or more of the following:

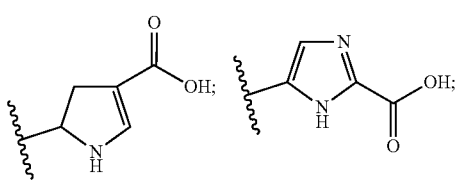

providing a lid over the die, wherein the polymerized material is disposed in at least a region between the lid and the die.

12. The method of claim 11, wherein the polymerized material is a polymer matrix and one of at least one of the monomers comprises a silicon monomer.

13. The method of claim 12, wherein the liquid metal is liquid at room temperature.

14. The method of claim 11, wherein the liquid metal is shaped in spheres.

15. The method of claim 14, wherein the polymerized material is a polymer matrix and the spheres are evenly distributed in the polymer matrix.

16. A thermal interface material for an integrated circuit package, the thermal interface material comprising:
a polymer matrix comprising copolymerized modified liquid metal comprising a monomer and a liquid metal, the monomer comprising a group and the group being bonded to the liquid metal by a chemical bond using C═O, S═O, N:, NH, and/or OH moiety,
wherein the group comprises one or more of the following:

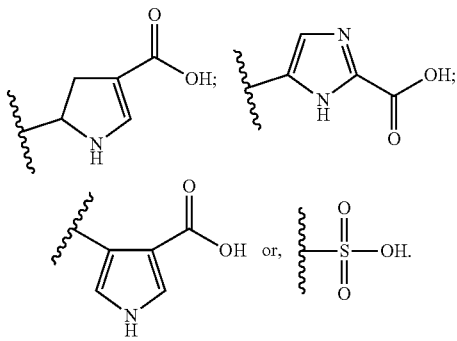

17. The thermal interface material of claim 16, wherein the polymer matrix comprises two or more monomers.

18. The thermal interface material of claim 17, wherein the modified liquid metal in the polymer matrix comprises surface modified liquid metal spheres.

19. The thermal interface material of claim 18, wherein the surface modified liquid metal spheres are evenly distributed in the polymer matrix.

20. The thermal interface material of claim 16, wherein the monomer comprises silicon and is an adhesion promoter.

* * * * *